United States Patent [19]
Pavlic

[11] 4,394,631
[45] Jul. 19, 1983

[54] RADIO FREQUENCY CHOKE AND METHOD OF USE

[75] Inventor: John C. Pavlic, Pleasant Gap, Pa.

[73] Assignee: C-Cor Electronics, Inc., State College, Pa.

[21] Appl. No.: 268,361

[22] Filed: May 29, 1981

[51] Int. Cl.³ .......................... H03H 7/46; H03H 7/09
[52] U.S. Cl. ..................................... 333/132; 333/112;
333/167; 333/175; 323/355
[58] Field of Search ............... 333/110, 112, 129, 131,
333/132, 167, 172, 175, 176, 177, 185, 181;
334/74; 323/355; 336/105, 155

[56] References Cited
U.S. PATENT DOCUMENTS

| | | | |
|---|---|---|---|
| 3,452,303 | 6/1969 | Babcock | 333/176 |
| 3,673,517 | 6/1972 | Ticknor | 333/131 |
| 3,747,028 | 7/1973 | Pennypacker | 333/112 |
| 3,835,370 | 9/1974 | Kaiserswerth et al. | 323/355 |

OTHER PUBLICATIONS

C-Cor Electronics Inc. Sales Literature, E-2, E-6 Revised 5-15-80, State College, Pa.

*Primary Examiner*—Paul L. Gensler
*Attorney, Agent, or Firm*—Stanley J. Price, Jr.; John M. Adams

[57] ABSTRACT

A broadband radio frequency signal are in the range between about 5 and 400 MHz and a single phase 60 Hz AC power signal are transmitted through a cable transmission line of a cable television system. Amplifiers are powered by the 60 Hz AC signal. The amplifiers are operable as repeater stations that transmit the radio frequency (RF) signal. An RF choke connected to the transmission line separates the 60 Hz AC signal from the broadband 5 to 400 MHz signal. The RF choke includes a conductor of a preselected gauge formed in a coil having a preselected number of turns wound around a ferrite coil form. A ferrite bead is in series with the coil on a selected turn of the coil. The ferrite bead displays an RF series resistance or impedance to the inductance of the coil and reduces the series resonance of the coil. A resistor is connected in parallel to a selected turn of the coil at the opposite end of the coil and functions as a shunt. The choke serves as a high impedance which is substantially flat over the selected frequency range of 5 to 400 MHz to the broadband signal and reduces losses in the amplifier signal.

14 Claims, 8 Drawing Figures

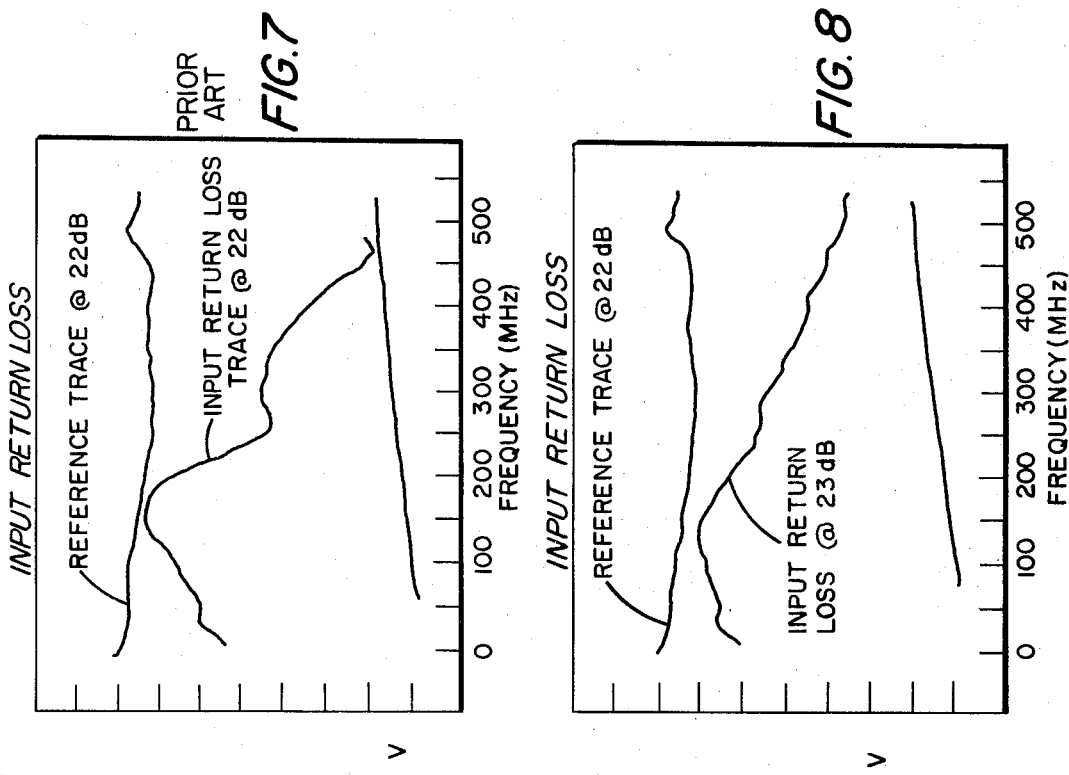
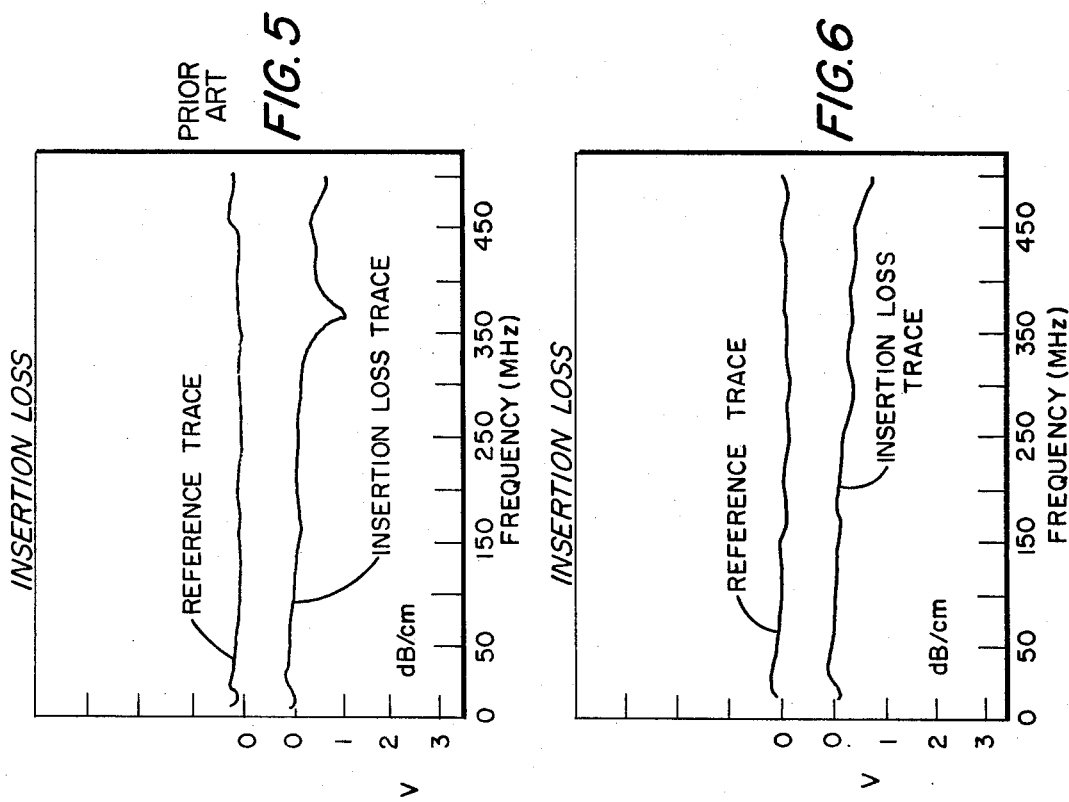

RADIO FREQUENCY CHOKE AND METHOD OF USE

BACKGROUND OF THE INVENTION

1. Field of the Invention

This invention relates to a radio frequency choke and more particularly to a method of separating a broadband radio frequency signal from an AC power signal by a radio frequency choke that forms a series DC resistance to the radio frequency signal and thus minimizes current loses in the AC power signal and reduces the series resonant effect of the radio frequency choke.

2. Description of the Prior Art

It is well known in the coaxial communications/distribution art, particularly in the transmission of cable television signals and data transmission to utilize a radio frequency choke (RFC) to separate a signal phase 60 Hz AC power signal from a broadband radio frequency signal. As commonly encountered in cable television transmissions the cable signal may be transmitted at a preselected signal at, for example, between 5 to 400 MHz. A signal phase 60 Hz power signal is also transmitted through the same cable that transmits the ratio frequency signal in order to supply power to the amplifiers associated with the cable transmission line. The amplifiers are positioned at selected locations and are powered by the single phase 60 Hz power signal. In cable television systems, the repeater stations transmit the radio frequency cable signal.

The single phase AC power that is utilized to amplify the radio frequency cable signal is transmitted at a current magnitude generally in the range between about 10 to 12 amps and has a peak current as high as 15 amps. The low power radio frequency cable signal is transmitted generally at low voltage, i.e., in the range of 0.3 volt. Therefore, the AC power system at the distribution points in the cable system must be separated or passed by the low power cable signal which is transmitted between 5–400 MHz. This is necessary in order to prevent the higher voltage AC power supply signal from damaging the transformer that receives the low power cable signal. If the high voltage AC power signal is transmitted through the transformer the transformer which represents a short to ground to AC power will be destroyed. Therefore, it is well known to utilize with main line passive devices, such as splitters, directional couplers, power inserters and the like, selected arrangements of radio frequency chokes to separate the 60 Hz AC power signal from the broadband 5–400 MHz cable transmission signal.

A conventional RFC includes a conductor formed of 18 gauge magnet wire wrapped a preselected number of turns around a ferrite coil form. Connected across one of the intermediate coils adjacent one end of the coil and the lead extending from the respective end coil is a resistor which functions as a shunt and has the effect of reducing the impedance of the RFC. This arrangement of wrapping a conductor around a ferrite coil form with the provision of the shunt resistor forms the equivalent of a high Q capacitor in series with the inductance of the wire or what is knwon as a series LC circuit.

One of the undesirable effects of this arrangement is a sharp loss in signal levels at the resonant frequency of the LC circuit. It has been the practice to utilize the parallel resistor across the coil to shunt the inductor in an effort to reduce the effective resonance of the LC circuit. Also in order to reduce the resonance encountered in the LC circuit attempts have been made to reduce the number of turns in the wire of the coil around the ferrite coil form. However, it has been found that this effort has resulted in providing the LC circuit with a resonant frequency which lies outside the passband of the circuit in which it is installed. Consequently, the total inductance of the RFC is reduced to a degree that it is no longer operable at the 5 MHz range.

Additional efforts to reduce the series resonance in an RFC include a reduction in the gauge of the wire forming the RFC coil. This effort has been found to reduce the resonance as a result of increasing the resistance in the wire; however, the overall effect on the LC circuit is a limitation in the amount of 60 Hz AC power that can be passed through the device. As indicated above, it is preferable that a current in the range of 10 to 12 amps and as high as 15 amps be passed through the device.

Another undesirable consequence encountered in the use of a conventional RFC to separate the AC power signal from the radio frequency transmission signal using the shunt arrangement as above described is a lowering of the impedance to ground. This results in an increase in the insertion loss for the respective band width of the radio frequency transmission signal. In addition, a sharp rate of change in the impedance of a reflected transmission signal from a passive unit results in unsatisfactory matching of the input and output signals through a passive unit. If the input return loss is sharp and exhibits a high degree of resonance then the output signal will not be properly matched with the input signal. The desirable situation is to have a substantially linear change in both the insertion loss and input return loss thereby requiring a dampening of the resonance in the coil of the RFC.

Therefore, there is need to provide in main line passive units utilized in cable television, data transmission, telephone communication and the like distribution lines a radio frequency choke that is effective to separate a high voltage AC power signal from a low voltage broadband radio frequency signal having a range between about 5 to 400 MHz. By dampening the series resonance of the radio frequency choke losses in the radio frequency transmission signal are minimized.

SUMMARY OF THE INVENTION

A radio frequency choke includes a coil form having a preselected cross sectional area. A conductor has a first end portion and a second end portion with an intermediate portion therebetween. The conductor is wound around the coil form thereby forming a coil having a preselected number of turns in the intermediate portion between the first and second end portions. A first resistor is connected in series with a preselected turn of the coil positioned adjacent the conductor first end portion. The first resistor forms a series impedance to the inductance of the coil to reduce the series resonance of the coil. A second resistor is connected in parallel between a preselected turn of the coil and the conductor second end portion.

Preferably, the conductor is an 18 gauge wire that is wound around the coil form having a preselected diameter to form a plurality of turns of the coil having a ¼ inch diameter. Preferably, the coil form is fabricated of a preselected material selected from the group consisting of ferrite, powder iron, or the like so as to exhibit a premeability adaptable for the transmission of radio frequency (RF) signals through the conductor having a range of between about 5 to 400 MHz.

The first RF resistor preferably includes a bead of a preselected material selected from the group consisting of ferrite, powder iron, or the like. The bead also has a preselected permeability adaptable for use with high frequency radio signals in the range between about 5 to 400 MHz. The second resistor includes a pair of leads which are connected to a selected turn of the coil and the conductor second end portion, respectively.

Most preferably the coil includes twenty-one coils between the conductor first and second end portions. The bead is preferably positioned on the coil so that the seventh turn of the coil from the first end portion of the conductor extends through the bead. Accordingly, the leads of the second resistor are connected between the conductor second end portion and the seventh turn from the conductor second end portion which is also the fourteenth turn from the conductor first end portion.

In application, a preselected number of radio frequency chokes of the present invention are arranged in a circuit associated with a cable transmission signal to separate or pass the low voltage cable transmission signal in the range between about 5 to 400 MHz from a high voltage AC power signal transmitted over the line through which the cable transmission signal is conveyed. The provision of the bead resistor in series with the coil forms an RF series resistance or impedance to the inductance of the coil so as to reduce the series resonance of the coil. By reducing the series resonance of the coil losses in the cable transmission signal are substantially reduced, particularly for a broadband cable transmission signal having a frequency in the range between about 5 to 400 MHz.

Accordingly, the principal object of the present invention is to provide a radio frequency choke for use in the transmission of broadband radio frequency signals where an AC power signal is conveyed through the transmission line, and the choke is operable to minimize current losses in the AC power signal.

Another object of the present invention is to provide a radio frequency choke for broadband application in communication signal transmission that adds series impedance to the inductance of the choke to minimize series resonance in the choke without reducing performance of the choke for a broad frequency range between 5-400 MHz.

An additional object of the present invention is to provide a main line passive unit for communication signal transmission that separates a power signal from the communication signal with a minimum loss in the communication signal having a broad frequency band.

A further object of the present invention is to provide a radio frequency choke having a resistance connected in series with an inductor to minimize the series resonance in the inductance for a broad frequency range.

These and other objects of the present invention will be more completely disclosed and described in the following specification, the accompanying drawings, and the appended claims.

BRIEF DESCRIPTION OF THE DRAWINGS

FIG. 5 is a diagrammatic representation of the insertion loss associated with known prior art radio frequency chokes, illustrating a sharp resonance in the insertion loss.

FIG. 6 is a diagrammatic representation of the insertion loss encountered with the radio frequency choke of the present invention, illustrating the desired dampening of resonance in the insertion loss.

FIG. 7 is a diagrammatic representation of the input return loss associated with the known prior art radio frequency chokes, illustrating a sharp resonance in the input return loss.

FIG. 8 is a diagramatic view of the input return loss associated with the radio frequency choke of the present invention, illustrating the desired dampening of the resonance in the input return loss.

DESCRIPTION OF THE PREFERRED EMBODIMENT

Figure 1:
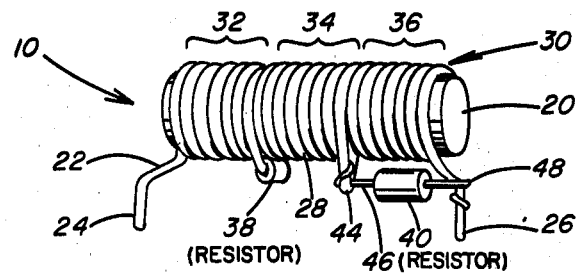
FIG. 1 is a fragmentary schematic perspective view of a radio frequency choke in accordance with the present invention, illustrating a wire coil around a form and a bead resistor connected in series with the coil.
Figure 2:
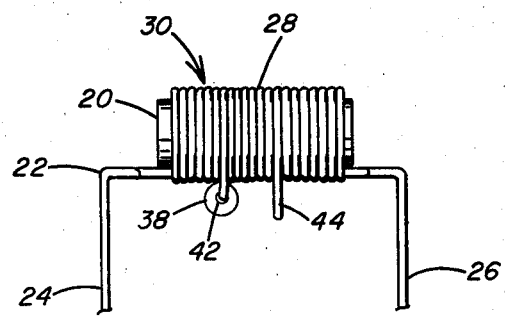
FIG. 2 is a view in side elevation of the radio frequency choke, illustrating the coil having one of the turns displaced to form a resistor loop for connection to a shunt resistor.
Figure 3:
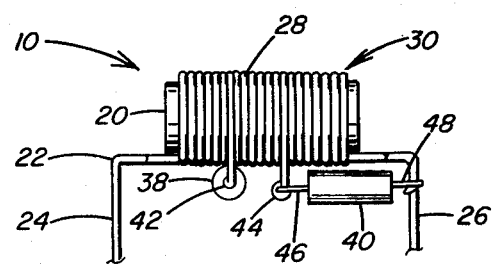
FIG. 3 is a further view in side elevation of the radio frequency choke, illustrating the series bead resistor and the parallel shunt resistor connected to selected turns of the coil.

Referring to the drawings and particularly to FIGS. 1-3, there is illustrated a radio frequency (RF) choke generally designated by the numberal 10. The radio frequency choke 10 is operable for use in the transmission of cable television signals, data transmission signals, telephone transmission signals, and related communications/distribution applications such with a directional coupler 12 illustrated in FIG. 4 for use in directing an input signal in two directions from the directional coupler 12, as will be explained later in greater detail.

The radio frequency choke 10 includes a coil form 20 which is fabricated of a preselected material having a premeability adaptable for use in transmitting radio frequency signals in the range between about 5 to 400 MHz. Preferably the coil form 20 is fabricated of a material selected from the group consisting of ferrite, powder iron, and the like. The coil form has a preselected cross sectional area and is preferably cylindrical, having a diameter no greater than 0.250 inches. A conductor 22 is wound a preselected number of turns around the coil form 20 and includes a first end portion 24 and a second end portion 26 with an intermediate portion 28 therebetween.

Preferably the conductor 22 is formed from 18 gauge wire wound around the coil form 20, forming a coil generally designated by the numeral 30. The coil 30 has a preselected number of turns in the intermediate portion 28 between the first and second end portions 24 and 26. The coil for purposes of illustration is divided into three sections 32, 34 and 36, each including seven turns.

A first RF resistor 38 is connected in a series with a preselected turn of the coil 30 and is positioned adjacent the conductor end portion 24. A second resistor 40 is connected in parallel between a preselected turn of the coil 30 and the conductor end portion 26. With the above arrangement, the resistor 38 forms a series impedance to the inductance of the coil 30 to reduce series resonance in the coil 30 for a broad range of frequencies without impairing the performance of the coil.

In one embodiment of the present invention, the RF resistor 38 includes a ferrite bead having a circular cross section, as illustrated in FIGS. 2 and 3, with an axial passage 42 therethrough. Preferably the conductor 22 is wound around a ferrite coil form 20, forming a series of 21 turns. The coil section 32 includes the first seven turns; the coil section 34, the second seven turns; and the coil section 36 the third seven turns. As illustrated in FIGS. 1-3, the seventh turn of the coil 30 passes through the passage 42 of the bead resistor 38 to connect the resistor 38 in series with the coil 30. The resistor 38 is positioned on the periphery of the coil 30 outside of the ferrite coil form 20. Spaced seven turns from the bead resistor 38 is formed a resistor loop 44 in the coil 30. The resistor loop 44 extends outwardly beyond the periphery of the coil 30. The conductor end portions 24 and 26 are bent to extend in a parallel arrangement away from the coil 30.

While the bead resistor 38 is connected in series with the coil 30, the resistor 40 is connected in parallel with the coil 30. As illustated in FIGS. 1 and 3, the resistor 40 includes a pair of leads 46 and 48. The resistor lead 46 is connected to the resistor loop 44, and the resistor lead 48 is connected to the conductor end portion 26. With this arrangement, the resistor 40 forms a shunt across the coil section 36.

Preferably for the radio frequency choke 10 used in the transmission of radio frequency signals in the range between about 5 to 400 MHz, the resistor 40 has a resistance of 510 ohms. A resistor of the type operable for use as the resistor 40 is commercially available from Allen-Bradley of Milwaukee, Wisconsin, and a ferrite bead operable for use as the bead resistor 38 is commercially available from Ferronics Incorporated. Similarly, the coil form 20 is commercially available from Ferronics Incorporated.

With the above described radio frequency choke 10, a single phase 60 Hz power supply signal in the range between about 10 to 15 amps is operable to be conveyed with a minimum of series resonance in the coil 30. The construction of the above described radio frequency choke 10 forms a series LC circuit operable to dampen the resonance normally encountered in the inductance of the coil 30 by the feature of the ferrite bead resistor 38 connected in series with the coil 30.

The ferrite bead resistor 38 serves as an RF series resistance or impedance to the inductance of the coil 30. This has the effect of reducing the series resonance of the coil and thereby substantially eliminates the sharp deflections normally encountered with conventional radio frequency chokes in the insertion loss, as diagrammatically illustrated in FIG. 5, and in the input return loss, as diagrammatically illustrated in FIG. 7. By the provision of the series connection of the bead resistor 38 in the coil 30 of the radio frequency choke 10, the series resonance through the coil 30 is substantially dampened to eliminate the sharp deflection in the insertion loss, as illustrated in FIG. 6, and in the input return loss, as illustrated in FIG. 8.

While the series connection of the bead resistor 38 to the coil 30 substantially dampens the series resonance in the inductance of the coil 30 at high frequencies, the presence of the bead resistor 38 does not impair the performance of the radio frequency choke at low frequencies. Uniform dampening is provided throughout the frequency range of 5 to 400 MHz. As encountered with a known conventional radio frequency choke, which includes only a shunt type resistor connected in parallel across the coil 30, the series connection of the bead resistor 38 to the coil 30 increases the radio frequency impedance in comparison with the shunt type of resistor connection which reduces the radio frequency impedance.

The series connection method is particularly desirable in reducing losses in the transmission of a cable television signal in the frequency range of 5 to 400 MHz. In the present invention, by combining the feature of the series connection of resistor 38 to the coil 30 and the parallel connection of the resistor 40 to the coil 30, a versatile radio frequency choke is provided. The insertion losses that normally occur at any frequency in the range of 5 to 400 MHz remain substantially the same and are free of sharp resonance. This is particularly important for amplification of the radio frequency transmission signals at selected points in the cable signal distribution line.

By dampening the resonance in the turns of the coil 30, the radio frequency choke 10 exhibits the highest possible impedance throughout the desired frequency range without sacrificing performance capability at low frequencies. Thus the inclusion of the resistor 40 in parallel across the coil section 36 equalizes the low frequency impedance and the high frequency impedance for the coil 30. Thus the radio frequency transmission signals being conveyed through a television cable experience a minimum of loss of the radio frequency signal.

Figure 4:
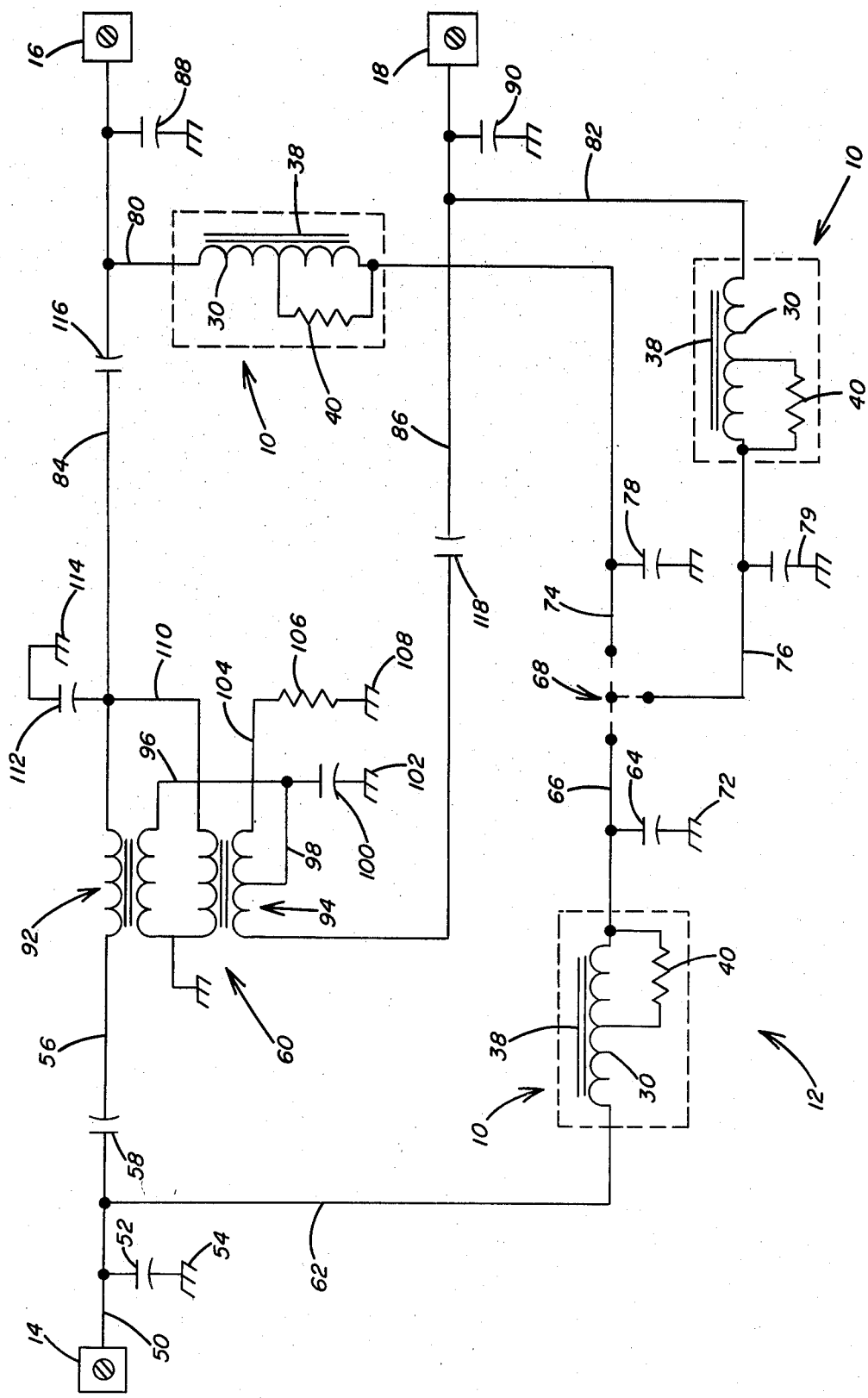
FIG. 4 is an electrical schematic of a directional coupler for receiving a radio frequency transmission signal and an AC power supply signal injected in the transmission signal, illustrating the use of a plurality of the radio frequency chokes operable to minimize resonance through the chokes.

Referring to FIG. 4, there is illustrated a commercial embodiment of a directional coupler 12 for use in transmitting a radio frequency signal that includes an AC power signal. The cable television signal is directed from a first input terminal 14 to the output terminals 16 and 18. The input signal at terminal 14 corresponds to the output signals at terminals 16 and 18. The radio frequency input signal received at input terminal 14 is a low power signal having a frequency preferably in the range between about 5 to 400 MHz. Injected into the transmission line with the radio frequency signal is a single phase 60 Hz power signal that is operable in a manner well known in the art of television cable transmission to power the amplifiers that amplify the radio frequency cable signal.

The input terminal 14 is connected by a lead 50 to a capacitor 52 which is connected to ground 54. The lead 50 from capacitor 52 is connected to a lead 56 connected, in turn, through a capacitor 58 to a transformer generally designated by the numeral 60 and to a lead 62 that is connected to the radio frequency choke 10 which is schematically illustrated in FIG. 4 to correspond to the radio frequency choke 10 illustrated in FIG. 1 described hereinabove. It should be understood that the remaining radio frequency chokes 10 illustrated in FIG. 4 correspond in structure to the configuration described above and illustrated in FIG. 1.

The capacitor 58 is operable as an input capacitor which permits the radio frequency signal to be conveyed through the lead 56 to the transformer 60 and at the same time impede the transmission of the single phase 60 cycle AC power signal through lead 56 to the transformer 60. The capacitor 58 thus represents a low impedance to the transmission of the radio frequency signal in the range between about 5 to 400 MHz. Accordingly, the 60 cycle AC power signal is transmitted from lead 50 through lead 62 to the first radio frequency choke 10.

The radio frequency choke 10 includes the coil 30 having the preselected number of turns as above described. The bead resistor 38 is connected in series with the coil 30. The resistor 40 is connected in parallel with the coil 30. The AC power signal is conveyed through the radio frequency choke 10 where the series resonance in the coil 30 is substantially minimized.

As shown by the tests conducted and illustrated in FIG. 6, with the radio frequency choke 10 the insertion loss of RF signals is substantially linear over the frequency range between about 5 to 500 MHz for a dB/cm of about 0.25. As compared to a conventional radio frequency choke, as illustrated in FIG. 5, the insertion loss occurs in a sharp spike at frequency of approximately 400 MHz for about a 0.75 dB/cm. Equivalent results with input return loss for the improved radio frequency choke 10 of the present invention are illustrated in FIG. 8. With the choke 10 the input return loss is linear over a wide frequency range between about 100 to 450 MHz with a 23 dB minimum. As compared to the input return loss experienced with a conventional radio frequency choke, as illustrated in FIG. 7, the return loss includes sharp resonant spikes throughout the entire frequency range for a 22 dB minimum.

The first radio frequency choke 10 is connected through a capacitor 64 in lead 66 to a jumper generally designated by the numeral 68. The capacitor 64 is connected to ground 72. In a well known manner the jumper 68 is operable to convey the AC input power signal to leads 74 and 76 or terminate the transmission of the AC power signal at the jumper 68. Thus, with the provision with the jumper the AC power signal is conveyed in selected directions.

As illustrated in FIG. 4, the jumper 68 transmits the AC power signals to both leads 74 and 76 which are, in turn, connected to respective radio frequency chokes 10 of the type discussed above. In addition, a pair of capacitors 78 and 79 are connected between ground and the respective leads 74 and 76 extending from the jumper 68 in a manner well known in the art.

The second and third radio frequency chokes 10 in the leads 74 and 76 are also operable to substantially minimize the series resonance in the respective coils 30. From the respective radio frequency chokes 10 extend leads 80 and 82 to leads 84 and 86, respectively, extending from the transformer 60 through which the radio frequency signal is conveyed. At the point of connection of the lead 80 to the lead 84 and the lead 82 to the lead 86 the radio frequency signal is combined with the AC power signal for transmission to the respective output terminals 16 and 18. A grounded output capacitor 88 is connected to the lead 84, and a grounded output capacitor 90 is connected to the lead 86. Capacitors 116 and 118 are operable to improve the return losses of the AC power signal to the transformer 60. The transformer 60 is operable to receive the low power radio frequency signal which would be destroyed by the AC power signal.

The transformer 60 is operable to receive a single input at a lower power radio frequency from lead 56 and generate output signals also at a corresponding frequency in the range between about 5 to 400 MHz to the leads 84 and 86. The transformer 60 includes a first section generally designated by the numeral 92 and a second section generally designated by the numeral 94.

With this arrangement, the radio frequency input signal is conveyed through the transformer section 92 to the lead 84 to the output terminal 16 and also through the transformer section 94 through the lead 86 to the output terminal 18. Both transformer sections 92 and 94 are connected by leads 96 and 98 to capacitor 100 which is connected to ground 102. Also the transformer section 94 is connected by lead 104 to a resistor 106 connected to ground 108. The transformer section 94 is also connected by lead 110 to a capacitor 112 grounded at 114. The transformer section 92 is also connected to the capacitor 112. The capacitor 112 is operable in a well known manner as a high frequency trimmer capacitor operable to improve the returns of the directional coupler 12.

With the above described transformer 60, the radio frequency input signal from lead 56 is transmitted to the pair of output leads 84 and 86 with a minimum of insertion loss occurring. The radio frequency output signals are also prevented from being fed back through the transformer 60 and to one of the other output leads. This arrangement is also operable to phase the radio frequency output signals at the leads 84 and 86 with the radio frequency input signal to the transformer 60. Thus, the radio frequency output signals are properly matched with the input signal for a range of frequency between about 5 to 400 MHz. The output signals are also prevented from being fed back to the transformer 60 or fed to the other corresponding output signal by the capacitors 116 and 118 in the leads 84 and 86.

Accordingly, with the above described directional coupler 12 utilizing the radio frequency chokes 10 of the present invention the single phase AC power signal passes through the directional coupler 12 and is separated from the lower power radio frequency transmission signal. Each of the radio frequency chokes 10 presents a high impedance to the inductance of the coils 30 to substantially minimize the series resonance in the respective coils 30. The high impedance is relatively flat over the frequency range of 5 to 400 MHz. By minimizing the series resonance in each of the coils 30 of the radio frequency chokes 10, cable signal losses are maintained at a minimum.

According to the provisions of the Patent Statutes, I have explained the principle, preferred construction, and mode of operation of my invention and have illustrated and described what I now consider to represent its best embodiments. However, it should be understood that, within the scope of the appended claims, the invention may be practiced otherwise than as specifically illustrated and described.

I claim:
1. A radio frequency choke comprising,
  a coil form having a preselected cross sectional area,
  a conductor having a first end portion and a second end portion with an intermediate portion therebetween,
  said conductor being wound around said coil form thereby forming a coil having a preselected number of turns in said intermediate portion between said first and second end portions,
  a first resistor connected in series with a preselected turn of said coil positioned adjacent said conductor first end portion,
  said first resistor forming a series impedance to the inductance of said coil to reduce the series resonance in said coil, and a second resistor connected in parallel between a preselected turn of said coil and said conductor second end portion.

2. A radio frequency choke as set forth in claim 1 in which,
said first resistor is positioned in series relation about one-third the distance down the coil from said conductor first end portion to add series impedance to the inductance of said coil.

3. A radio frequency choke as set forth in claim 1 in which,
said first resistor forms a series impedance to the inductance of said coil to dampen the resonance in said coil.

4. A radio frequency choke as set forth in claim 1 in which,
said first resistor includes a bead resistor selectively positioned on one of said turns of said coil to form a series impedance to the inductance of said coil and substantially minimize the series resonance in said coil.

5. A radio frequency choke as set forth in claim 1 in which,
said first resistor includes a bead-type material fabricated of a material selected from the group consisting of ferrite and powder iron.

6. A radio frequency choke as set forth in claim 1 in which,
said bead-type resistor had a permeability adaptable for use to present a series impedance to the inductance of said coil for radio signals having a frequency in the range between about 5 to 400 MHz.

7. A radio frequency choke as set forth in claim 1 in which,
said coil form has a cylindrical configuration to thereby form said coil with an inside diameter of about 0.25 inches.

8. A radio frequency choke as set forth in claim 1 in which,
said coil from is fabricated of a material selected from the group consisting of ferrite and powder iron.

9. A radio frequency choke as set forth in claim 1 in which,
said conductor is an 18 gauge wire wound around said coil form a preselected number of turns to form said coil.

10. A radio frequency choke as set forth in claim 1 in which,
said coil includes twenty-one turns between said conductor first and second end portions,
said first resistor being positioned on the seventh turn spaced from said conductor first end portion in series with said coil, and
said second resistor being connected to the fourteenth and twenty-first turns spaced from said conductor first end portion in parallel with said coil.

11. A signal distribution passive unit comprising,
an input terminal for receiving an input signal including a radio frequency input signal and an AC power input signal,
a first output terminal and a second output terminal for transmitting a first output signal and a second output signal, said first and second output signals being matched to said input signal,
transformer means for receiving said radio frequency input signal to direct said radio frequency input signal to said first and second output terminals,
said transformer means being connected to said input terminal and said first and second output terminals,
choke means for separating said radio frequency input signal from said AC power input signal to prevent said AC power input signal from being transmitted to said transformer means,
said choke means being connected to said input terminal and to said first and second output terminals to by-pass said transformer means, and
said choke means including an inductor coil having a resistor connected in series with said coil to present a high impedance to the inductance of said coil and reduce the series resonance in the coil and thereby prevent reductions in the magnitude of said AC power input signal for a broadband of radio frequencies.

12. A signal distribution passive unit as set forth in claim 11 in which,
said choke means includes a plurality of coils wound on a coil form and having an impedance connected in series with the inductance of said coils to reduce the series resonance in said coils.

13. A signal distribution passive unit as set forth in claim 12 in which,
said coils are connected to said input terminal and said first and second output terminals, and
said coils being operable to separate said AC power input signal transmitted at 60 Hz from said radio frequency input signal transmitted at between about 5 to 400 MHz.

14. A signal distribution passive unit as set forth in claim 11 in which,
said choke means includes a plurality of coils each including 18 gauge wire wound around a ferrite coil form a preselected number of turns,
a bead-type resistor connected in series with said respective coil at a preselected turn of said coil, and
a shunt-type resistor connected in parallel with said respective coil at a preselected turn of said coil.

* * * * *